(12) United States Patent
Hawkins et al.

(10) Patent No.: US 7,485,950 B2
(45) Date of Patent: Feb. 3, 2009

(54) IMPACT IONIZATION AMPLIFICATION APPARATUS METHOD AND SYSTEM

(75) Inventors: Aaron R. Hawkins, Provo, UT (US); Hong-Wei Lee, Meridian, ID (US)

(73) Assignee: Brigham Young University, Provo, UT (US)

( * ) Notice: Subject to any disclaimer, the term of this patent is extended or adjusted under 35 U.S.C. 154(b) by 291 days.

(21) Appl. No.: 11/457,710

(22) Filed: Jul. 14, 2006

(65) Prior Publication Data

US 2007/0014070 A1    Jan. 18, 2007

Related U.S. Application Data

(60) Provisional application No. 60/699,102, filed on Jul. 14, 2005.

(51) Int. Cl.
*H01L 29/06* (2006.01)
(52) U.S. Cl. .................... 257/656; 257/458; 257/11; 257/E29.336; 257/E31.061
(58) Field of Classification Search ................. 257/656, 257/E29.336, 458, E31.061, 11
See application file for complete search history.

(56) References Cited

U.S. PATENT DOCUMENTS

| 5,509,105 | A | * | 4/1996 | Roenker et al. ............... 706/33 |
| 5,602,413 | A | * | 2/1997 | Morishita ................... 257/438 |
| 2003/0030951 | A1 | * | 2/2003 | Green .......................... 361/56 |
| 2004/0046176 | A1 | * | 3/2004 | Kim et al. ..................... 257/83 |

* cited by examiner

*Primary Examiner*—Long K Tran
(74) *Attorney, Agent, or Firm*—Steve McDaniel; Utah Valley Patent

(57) ABSTRACT

An input signal comprising electronic carriers is injected into an impact ionization device with a high electric field whereupon the electronic carriers are accelerated toward an electron collector or hole sink and subsequently ionize additional electrons and holes that accelerated toward the electron collector and hole sink respectively. When properly biased an avalanche effect may occur that is proportional to the current injected into the impact ionization device via the input electrode. As a result, the input signal is amplified to provide an amplified signal. The described amplifier may be integrated with an input device such as a photodiode, and a transimpedance output amplifier onto a common substrate resulting in high performance high density sensor arrays and the like.

16 Claims, 5 Drawing Sheets

IMPACT IONIZATION AMPLIFICATION APPARATUS METHOD AND SYSTEM

RELATED APPLICATIONS

This application claims priority to U.S. Provisional Patent Application No. 60/699,102 entitled "Solid-State Current Amplifier Based on Impact Ionization" and filed on 14 Jul. 2005 for Aaron R. Hawkins, and Hong-Wei Lee which is incorporated herein by reference.

BACKGROUND OF THE INVENTION

1. Field of the Invention

This invention relates generally to current amplification means and methods, and more particularly relates to systems, apparatus, and methods for current amplification by impact ionization.

2. Description of the Related Art

The invention presented herein was developed in an effort to create an electronic device capable of producing impact ionization based current gain for a signal from an arbitrary current source. Other devices such as avalanche photodiodes and IMPATT diodes utilize impact ionization gain, but the current sources for these structures reside within the depletion regions of the devices themselves. Consequently, an attempt to "wire up" a current source to one of these devices would result in no current gain.

Impact ionization based gain is attractive because it can provide very low noise amplification for small current signals. The value of impact ionization based gain is easily illustrated by the continued use and development of avalanche photodiodes for the detection of low light signals. Avalanche photodiodes provide an additional gain to a photocurrent generated within their depletion regions while operating below the noise floor of transistor based amplifiers (transimpedance amplifiers) used to convert current into readable voltage levels. Levels of light can thus be detected that would be indistinguishable without the additional gain provided by the avalanche photodiodes.

From the foregoing discussion, it should be apparent that a need exists for a system, apparatus, and method that leverage the current gain characteristics of impact ionization to enable amplification of a signal provided by an arbitrary current source.

SUMMARY OF THE INVENTION

The present invention has been developed in response to the present state of the art, and in particular, in response to the problems and needs in the art that have not yet been fully solved by previously available current amplification means and methods. Accordingly, the present invention has been developed to provide a system, apparatus, and method to amplify a current signal that overcomes many or all of the above-discussed shortcomings in the art.

In one aspect of the present invention, an impact ionization amplifier includes an input electrode configured to receive an input signal comprising electronic carriers, an impact ionization device in electronic communication with the input electrode, the impact ionization device comprising a material configured to receive the electronic carriers and provide additional electronic carriers via impact ionization, an electron collector configured and biased to attract electrons from the impact ionization device, and a hole sink configured and biased to attract holes from the impact ionization device.

Carriers injected by the input signal are accelerated toward the electron collector or hole sink and subsequently impact atoms within the atomic structure of the impact ionization device. As a result, additional electrons and holes are ionized and accelerated toward the electron collector and hole sink respectively. When properly biased, an avalanche effect may occur that is proportional to the current injected into the impact ionization device via the input electrode. As a result, the input signal is amplified to provide an amplified signal.

The electron collector and hole sink may be made of a n type semiconductor and a p type semiconductor respectively. In some embodiments, the electron collector, impact ionization device, and hole sink are integrated onto a semiconductor substrate and essentially form a PIN diode structure. A depletion region may also be associated with either the electron collector or hole sink, and the PIN diode structure may be reverse biased in order to create an electric field that supports impact ionization. The impact ionization device may be made of a semiconductor material having an effective K value (carrier ionization ratio) of less than 0.7 and in some cases less than 0.01. Using a material with a low K value such as silicon may reduce the noise and increase the bandwidth of the amplifier.

In another aspect of the present invention, a system to amplify a current signal provided by an input device includes an input device configured to provide an input signal comprising electronic carriers, and an impact ionization amplifier configured to amplify the input signal via impact ionization and provide an amplified signal, the impact ionization amplifier comprising an input electrode configured to receive the input signal, an electron collector configured and biased to attract electrons, and a hole sink configured and biased to attract holes. The system may also include a transimpedance amplifier configured to receive and further amplify the amplified signal to provide an output signal. In certain embodiments, the input device, impact ionization amplifier, and transimpedance amplifier may be integrated into a common substrate.

In another aspect of the present invention, a method to amplify a current signal provided by an input device includes providing an electron collector and hole sink, receiving an input signal comprising electronic carriers, generating additional electronic carriers via impact ionization, collecting electrons with the electron collector and holes with the hole sink. The method may be conducted using one or more semiconductor devices capable of supporting impact ionization and separating the resulting hole flow and electron flow.

The present invention harnesses the current gain characteristics of impact ionization to provide improved signal amplification means and methods. It should be noted that references within this specification to features, advantages, or similar language does not imply that all of the features and advantages that may be realized with the present invention should be or are in any single embodiment of the invention. Rather, language referring to the features and advantages is understood to mean that a specific feature, advantage, or characteristic described in connection with an embodiment is included in at least one embodiment of the present invention. Thus, discussion of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize that the invention may be practiced without one or more of the specific features or advantages of a particular embodiment. In other instances, additional features and advantages may be recognized in certain embodiments that may not be present in all embodiments of the invention.

The aforementioned features and advantages of the present invention will become more fully apparent from the following description and appended claims, or may be learned by the practice of the invention as set forth hereinafter.

BRIEF DESCRIPTION OF THE DRAWINGS

In order that the advantages of the invention will be readily understood, a more particular description of the invention briefly described above will be rendered by reference to specific embodiments that are illustrated in the appended drawings. Understanding that these drawings depict only typical embodiments of the invention and are not therefore to be considered to be limiting of its scope, the invention will be described and explained with additional specificity and detail through the use of the accompanying drawings, in which.

DETAILED DESCRIPTION OF THE INVENTION

Reference throughout this specification to "one embodiment," "an embodiment," or similar language means that a particular feature, structure, or characteristic described in connection with the embodiment is included in at least one embodiment of the present invention. Thus, appearances of the phrases "in one embodiment," "in an embodiment," and similar language throughout this specification may, but do not necessarily, all refer to the same embodiment.

Figure 1:
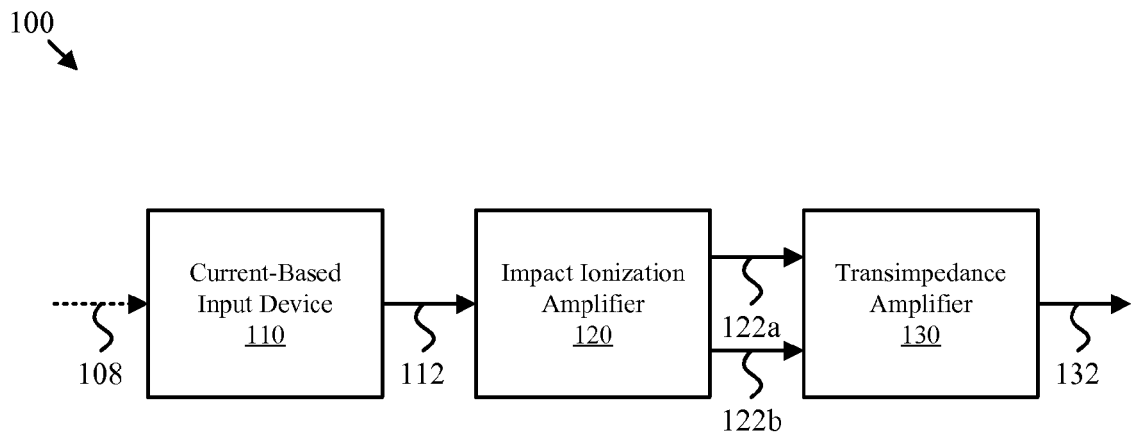
FIG. 1 is a schematic block diagram depicting one embodiment of an impact ionization amplification system of the present invention.

FIG. 1 is a schematic block diagram depicting one embodiment of an impact ionization amplification system 100 of the present invention. As depicted, the amplification system 100 includes a current-based input device 110, an impact ionization amplifier 120, and an optional transimpedance amplifier 130. The amplification system 100 leverages the current amplification capabilities of impact ionization to amplify a current signal 112 provided by the current-based input device 110.

The current-based input device 110 may be any device capable of generating a current signal 112 such as a sensor, transducer, photodiode, or the like. The current signal 112 may correspond to a metric of interest in a control system, communication system, or the like. In certain embodiments, the input device may be responsive to an input 108. For example, the input device may be a photodiode that is responsive to photons of a particular wavelength interval. In many instances, the current signal 112 provided by the input device 110 may be too weak to use or measure with conventional techniques.

The impact ionization amplifier 120 receives the current signal 112 and provides one or more amplified signals 122 via impact ionization. The amplified signals 122a and 122b may be biased to separate hole flow from electron flow and facilitate gain within the impact ionization amplifier 120. In the depicted embodiment, the amplified signal 122a corresponds to electron flow within the impact ionization amplifier 120 and the amplified signal 122b corresponds to hole flow within the impact ionization amplifier 120.

The transimpedance amplifier may receive one or both of the amplified current signals 122 and provide additional amplification to provide an output signal 132. The output signal 132 may be a voltage-based signal that is measurable and/or usable by conventional means such as an A/D converter or an electronic control system.

Figure 2:
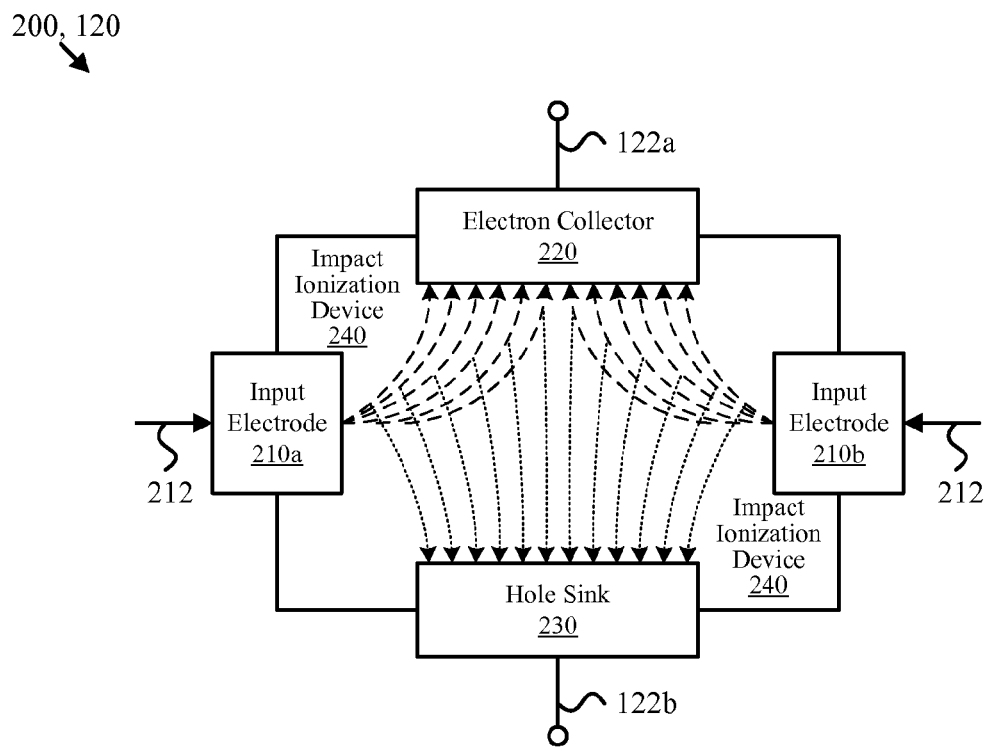
FIG. 2 is a schematic block diagram depicting one embodiment of an impact ionization amplifier of the present invention.

One benefit of the modular nature of the amplification system 100 is the separation of the detection, current amplification, and voltage amplification functions of a system. The input device 110, impact ionization amplifier 120, and transimpedance amplifier 130 may be individually optimized and packaged as discrete components or integrated onto a common substrate or integrated circuit. Another advantage is that impact ionization can provide lower-noise gain than available with transistor based amplifiers FIG. 2 is a schematic block diagram depicting one embodiment of an impact ionization amplifier 200 of the present invention. As depicted, the impact ionization amplifier 200 includes one or more input electrodes 210, electron collectors 220, and hole sinks 230 that are connected to, or integrated with, an impact ionization device 240. The impact ionization amplifier 200 is one example of the impact ionization amplifier 120 depicted in FIG. 1.

The input electrodes 210 conduct a current signal 212 to the impact ionization device 240. Depending on the bias voltage of the particular embodiment, the current signal 212 may inject holes or carriers into the impact ionization device 240. In the depicted embodiment, the current signal 212 injects electrons which are accelerated toward the electron collector 220 due to a positive bias of the electron collector 220 relative to the input electrodes 210.

As the electrons flow toward the electron collector 220 additional electrons and holes are freed from the atomic structure of the device 240 via impact ionization which in turn releases additional electrons and holes. The freed holes result in a hole flow (shown as dotted arrows) toward the hole sink due to a negative bias of the hole sink 230 relative to the input electrodes 210 and the electron collector 220. Similarly, the freed electrons result in an electron flow (shown as dashed arrows) toward the electron collector 220. The depicted electron flow corresponds to the amplified current signal 122a and the depicted hole flow corresponds to the amplified current signal 122b.

Figure 6A:
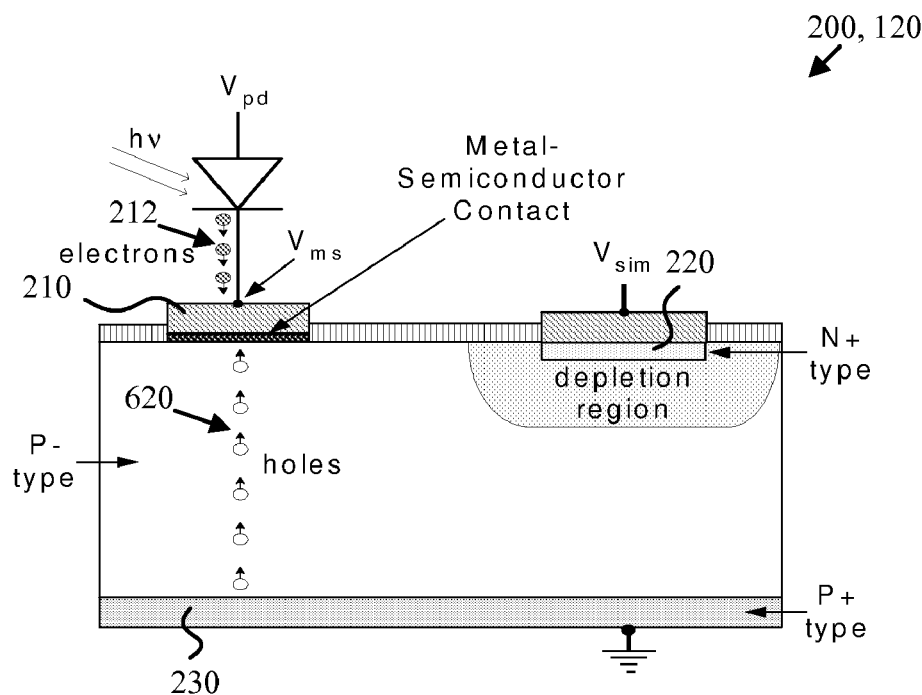
FIGS. 6a and 6b are schematic illustrations depicting the carrier flow in one particular embodiment of the impact ionization amplifier of FIG. 2.
Figure 6B:
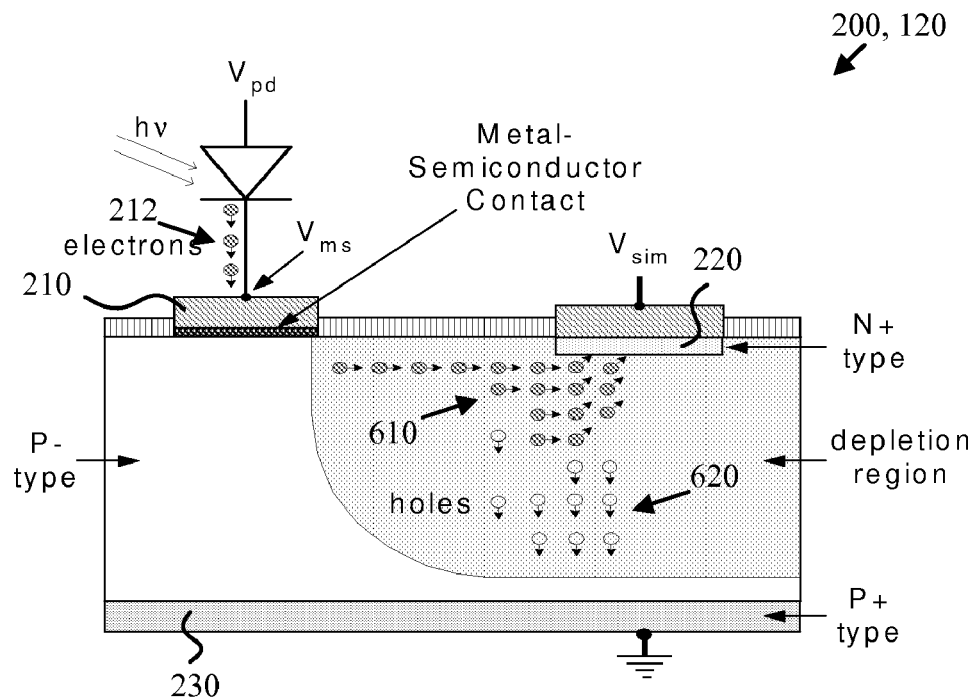

To facilitate electron flow, the electron collector 220 may comprise an n type region of material that is configured and biased to attract electrons. Similarly, the hole sink 230 may comprise a p type region of material that is configured and biased to attract holes. Depending on the intrinsic material type of the impact ionization device, a depletion region may be associated with the electron collector 220 or the hole sink 230. FIGS. 6a and 6b show one example of such a depletion region in operation.

In certain embodiments, the electron collector 220, hole sink 230, and impact ionization device 240 may collectively form a PIN diode structure that is reversed biased to enable impact ionization. In those embodiments, the input electrode(s) 212 may inject current into a region of the impact ionization device 230 that corresponds to an intrinsic (lightly doped p or n type semiconductor) region of a PIN diode structure.

The impact ionization amplifier 200 may be fabricated using standard semiconductor fabrication techniques either as a discrete (high power) device, or functional unit within an integrated circuit, or as an array of functional units within an integrated circuit. Furthermore, the impact ionization amplifier 200 can provide lower noise current gain than transistor based transimpedance amplifiers and may be cascaded in series to provide arbitrarily high current gains.

Figure 3:
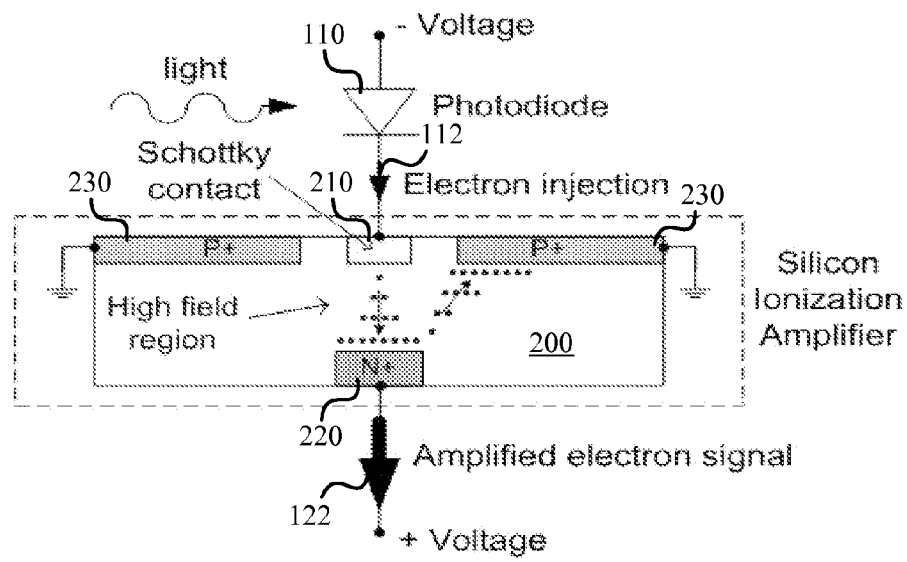
FIG. 3 is a schematic diagram depicting the application of one particular embodiment of the impact ionization amplifier of FIG. 2.

FIG. 3 is a schematic diagram depicting the application of one particular embodiment of the impact ionization amplifier 200. In the depicted application, the electron collector 220 is positively biased, the input electrode 210 is negatively biased, and the holes sinks 230 are grounded. During operation, the impact ionization amplifier 200 receives a current signal 112 from an input device 110 which in the depicted application is a reversed biased photodiode. The high field region between the input electrode 210 and the electron collector 220 enables impact ionization and current gain on the signal 112. As a result the input signal 112 is amplified to provide the amplified signal 122.

Figure 4A:
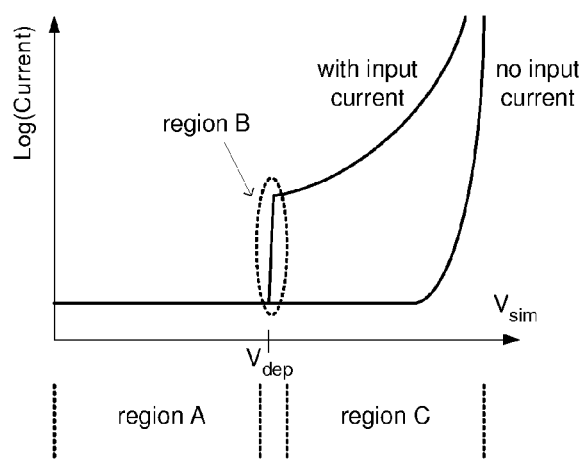
FIGS. 4a and 4b are graphs illustrating, respectively, the idealized and measured operating characteristics of one embodiment of the impact ionization amplifier depicted in FIG. 3
Figure 4B:
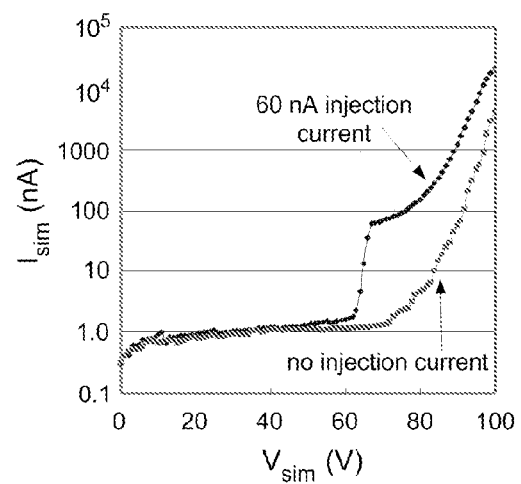

FIGS. 4a and 4b are graphs illustrating, respectively, the idealized and measured operating characteristics of one embodiment of the impact ionization amplifier depicted in FIG. 3. Region A corresponds to bias voltages that are insufficient to enable impact ionization. Region B corresponds to a bias voltage that increases the size of the depletion region so that it begins to overlap with the input electrode. Region C corresponds to an operating region where the current through the impact ionization device is amplified through impact ionization.

Figure 5:
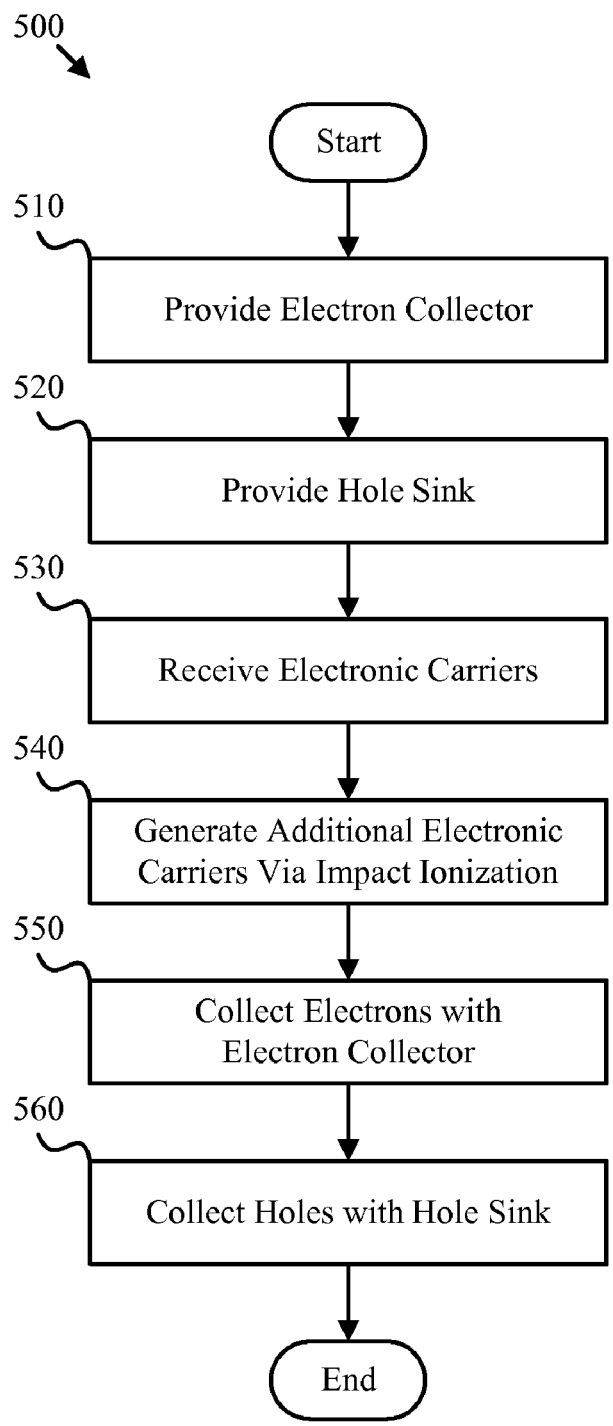
FIG. 5 is a flowchart diagram depicting one embodiment of an impact ionization amplification method of the present invention.

FIG. 5 is a flowchart diagram depicting one embodiment of an impact ionization amplification method 500 of the present invention. As depicted, the amplification method 500 includes providing 510 an electron collector, providing 520 a hole sink, receiving 530 electronic carriers, generating 540 additional electronic carriers, collecting 550 electrons with the electron collector, and collecting holes 560 with the hole sink. The impact ionization method 500 may be conducted using one or more semiconductor devices capable of supporting impact ionization and separating of the resulting hole flow and electron flow. The depicted operations need not be sequentially executed or executed in the depicted order for successful operation.

Providing 510 an electron collector may include providing a region of n type semiconductor material that is shaped and biased to attract electrons. Similarly, providing 520 a hole sink may include providing a region of p type semiconductor material that is shaped and biased to attract holes. Receiving 530 electronic carriers may include receiving carriers corresponding to an input signal into an intrinsic region of semiconductor material that is adjacent to the electron collector and hole sink. The electronic carriers may be injected by an input signal generated by an input device.

Generating 540 additional electronic carriers may involve accelerating electronic carriers in a high field resulting in impact ionization and the release of holes and electrons from the atomic structure. The high field may also result in an avalanche effect thus providing high current gain to the input signal. Collecting 550 electrons with the electron collector and collecting holes 560 with a hole sink may include properly biasing the electron collector and the hole sink to collect a substantial portion of the injected holes or electrons as well as the generated holes and electrons.

FIGS. 6a and 6b are schematic illustrations depicting the carrier flow in one particular embodiment of the impact ionization amplifier of FIG. 2. FIG. 6a shows the electron flow 610 and hole flow 620 when the bias voltage Vsim is insufficient to enable impact ionization. Conversely, FIG. 6b shows the electron flow 610 and hole flow 620 when the bias voltage Vsim is sufficient to increase the size of the depletion region resulting in an overlap with the input electrode 210 and inducing impact ionization and amplification of the input signal 212.

One of skill in the art will appreciate that separation of the hole flow from the electron flow reduces the recombination of holes and electrons and enables amplification of the input signal 212. In the depicted embodiment, the electron flow 610 is substantially horizontal and the hole flow 620 is substantially vertical. Proper placement and biasing of the input electrode 210, electron collector 220, and hole sink 230 can reduce the probability of electron and hole recombination and increase the current gain and reduce the noise of the impact ionization amplifier 200.

Figure 7:
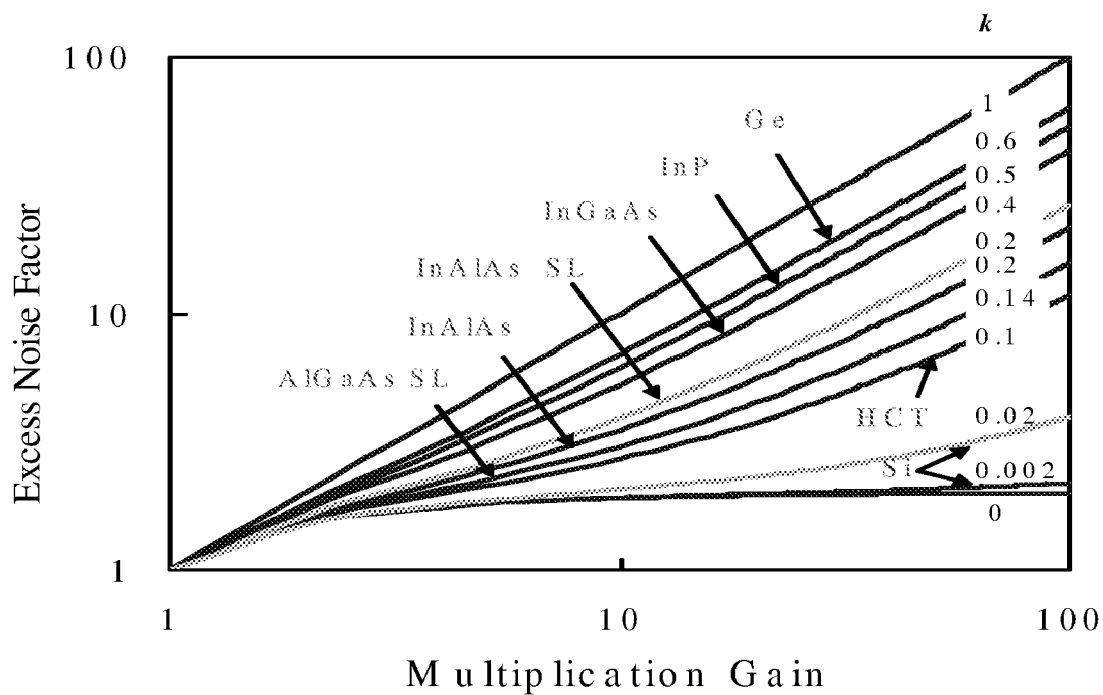
FIG. 7 is a graph illustrating the expected relationship between an effective K value and the noise characteristics of an impact ionization amplifier.

FIG. 7 is a graph illustrating the expected relationship between an effective K value (carrier ionization ratio) and the noise characteristics of an impact ionization amplifier. As is shown, materials having a low K value (carrier ionization ratio) tend to have less noise at equivalent gain levels.

Figure 8:
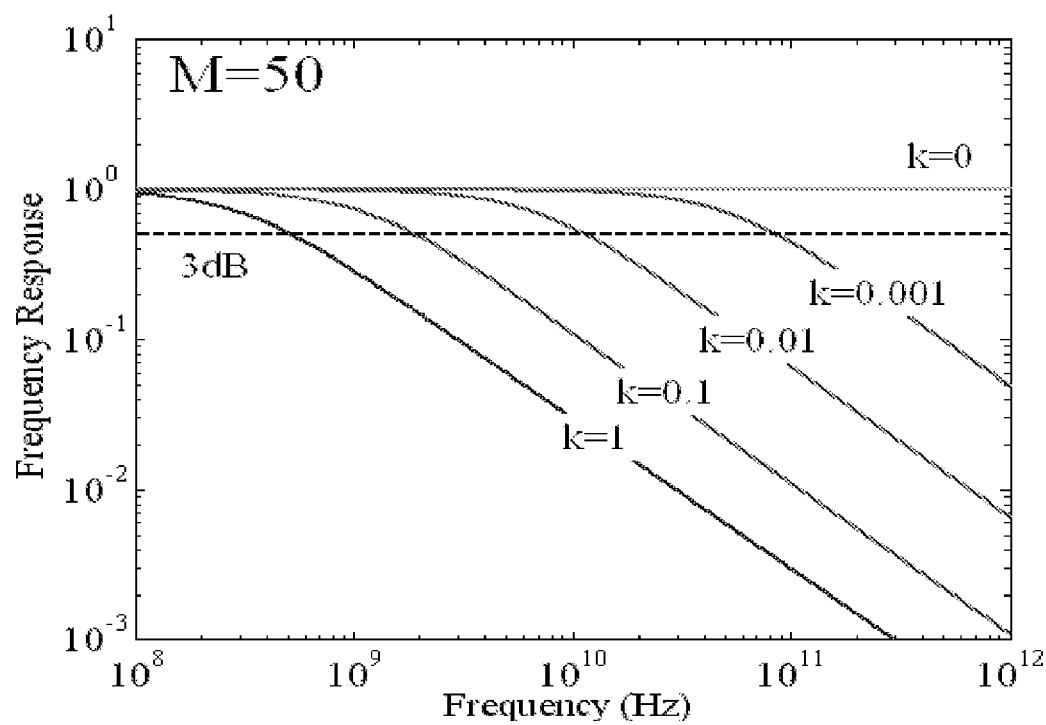
FIG. 8 is a graph illustrating the expected relationship between an effective K value and the frequency response of an impact ionization amplifier.

FIG. 8 is a graph illustrating the expected relationship between an effective K value and the frequency response of an impact ionization amplifier. As is shown, materials having a low K value experience faster response times and greater frequency bandwidth.

The present invention harnesses the current gain characteristics of impact ionization to provide improved signal amplification means and methods. Semiconductors of different types can be used for detection and current amplification. For example, when applied to photodetection applications, the wavelength response characteristics of a photodiode input device may be selected independent of the current amplification characteristics of the impact ionization amplifier.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. An apparatus to amplify a current signal provided by an input device, the system comprising:

an input electrode configured to receive an input signal comprising electronic carriers;

an impact ionization device in electronic communication with the input electrode, the impact ionization device comprising a material configured to receive the electronic carriers and provide additional electronic carriers via impact ionization, the additional electronic carriers comprising both holes and electrons;

an electron collector configured and biased to attract electrons from the impact ionization device;
a hole sink configured and biased to attract holes from the impact ionization device and
wherein the electron collector, impact ionization device, and hole sink are integrated into a semiconductor substrate and essentially form a PN diode structure.

2. The apparatus of claim 1, wherein the hole sink comprises a p type semiconductor configured for hole collection.

3. The apparatus of claim 2, wherein the hole sink is integrated into the impact ionization device.

4. The apparatus of claim 1, wherein the electron collector comprises a n type semiconductor configured for electron collection.

5. The apparatus of claim 4, wherein the electron collector is integrated into the impact ionization device.

6. The apparatus of claim 5, wherein the impact ionization device comprises silicon.

7. The apparatus of claim 1, wherein the impact ionization device comprises a depletion region configured to create an electric field for the holes and electrons.

8. The apparatus of claim 1, wherein the PN diode structure is reversed biased.

9. The apparatus of claim 1, wherein the input electrode is selected from the group consisting of a metal-semiconductor interface, an ohmic contact, a schottky contact, a tunneling contact, a doped semiconductor, and a semiconductor heterojunction.

10. The apparatus of claim 1, wherein the impact ionization device comprises a semiconductor material having an effective K value of less than 0.7.

11. A system to amplify a current signal provided by an input device, the system comprising:
an input device configured to provide an input signal comprising electronic carriers; and
an impact ionization amplifier configured to amplify the input signal via impact ionization and provide an amplified signal, the impact ionization amplifier comprising an input electrode configured to receive the input signal, an electron collector configured and biased to attract electrons, and a hole sink configured and biased to attract holes, wherein the electron collector, impact ionization device, and hole sink are integrated into a semiconductor substrate and essentially form a PN diode structure.

12. The system of claim 11, wherein the input device is selected from the group consisting of a reverse biased diode, a charge collector, and a photodiode.

13. The system of claim 11, further comprising a transimpedance amplifier configured to receive and further amplify the amplified signal to provide an output signal.

14. The system of claim 11, wherein the transimpedance amplifier comprises differential inputs.

15. The system of claim 11, wherein the input device and the impact ionization amplifier are included in the same integrated circuit.

16. A method to amplify a current signal provided by an input device, the method comprising:
providing a hole sink comprising a p type semiconductor configured for hole collection;
providing an electron collector comprising a n type semiconductor configured for electron collection;
receiving an input signal comprising electronic carriers;
generating additional electronic carriers via an impact ionization device, the additional electronic carriers comprising both holes and electrons;
collecting electrons with the electron collector;
collecting holes with the hole sink ;and
wherein the electron collector, impact ionization device, and hole sink are integrated into a semiconductor substrate and essentially form a PN diode structure.

* * * * *